United States Patent [19]
Bench

[11] 3,971,984
[45] July 27, 1976

[54] WIDE-RANGE LOGARITHMIC RESPONDING TRANSLATION CIRCUIT

[75] Inventor: Stephen Michael Bench, Lake Zurich, Ill.

[73] Assignee: B-Cubed Engineering, Inc., Elgin, Ill.

[22] Filed: Sept. 4, 1974

[21] Appl. No.: 502,948

[52] U.S. Cl. .............................. 324/132; 324/119; 328/145
[51] Int. Cl.² ................... G01R 15/10; G01R 19/22
[58] Field of Search ............ 324/119, 132; 328/145; 307/230; 330/110

[56] References Cited
UNITED STATES PATENTS

| | | | |
|---|---|---|---|
| 3,392,287 | 7/1968 | McFadyen et al. | 328/145 |
| 3,479,593 | 11/1969 | Dissing et al. | 328/145 |
| 3,499,160 | 3/1970 | Gordon | 328/145 |
| 3,500,198 | 3/1970 | Kaiser et al. | 324/132 |
| 3,683,275 | 8/1972 | Fowler | 328/145 |
| 3,727,129 | 4/1973 | Hummert | 324/132 |

*Primary Examiner*—R. V. Rolinec
*Assistant Examiner*—Ernest F. Karlsen
*Attorney, Agent, or Firm*—William J. Michals

[57] ABSTRACT

The disclosed circuit provides a wideband, wide-range logarithmic responding voltmeter particularly suitable for use as a transducer analyzer. The circuit includes an input for receiving a given A.C. input signal which can vary within a 100 db dynamic range. The input signal is coupled to a buffer amplifier the output of which is capacitively coupled to a logarithmic converter. The converter includes an operational amplifier and provides an A.C. output signal which is proportional to the logarithm of its A.C. input signal. The open loop gain of the operational amplifier is utilized to provide the A.C. output signal. The output signal of the converter is capacitively coupled to a precision AC/DC converter which rectifies and filters the output signal to provide a D.C. output voltage the level of which is, therefore, also proportional to the logarithm of the given A.C. input signal within its 100 db range. The D.C. output voltage is coupled to utilization means such as a logarithmically calibrated chart recorder or meter. The precision AD/DC converter also includes a zero-adjustment for nulling any offsets in its circuit and any residual noise at the output of the logarithmic converter. Accordingly, with no input signal applied to the disclosed circuit the output recorder and/or meter stably read exactly zero ("0").

18 Claims, 1 Drawing Figure

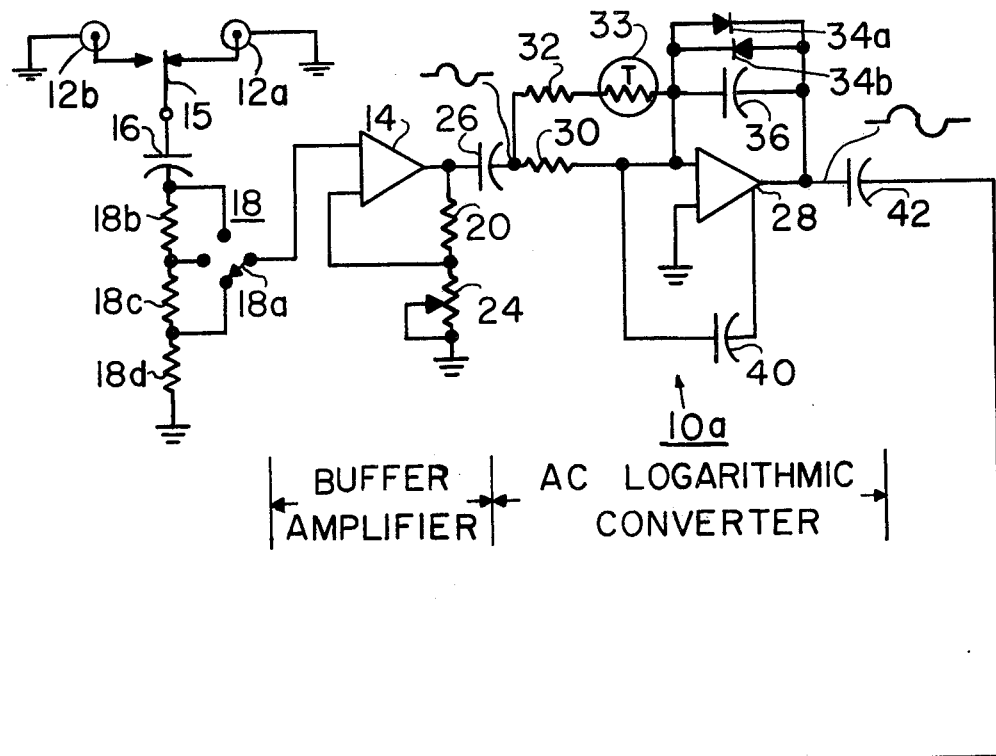
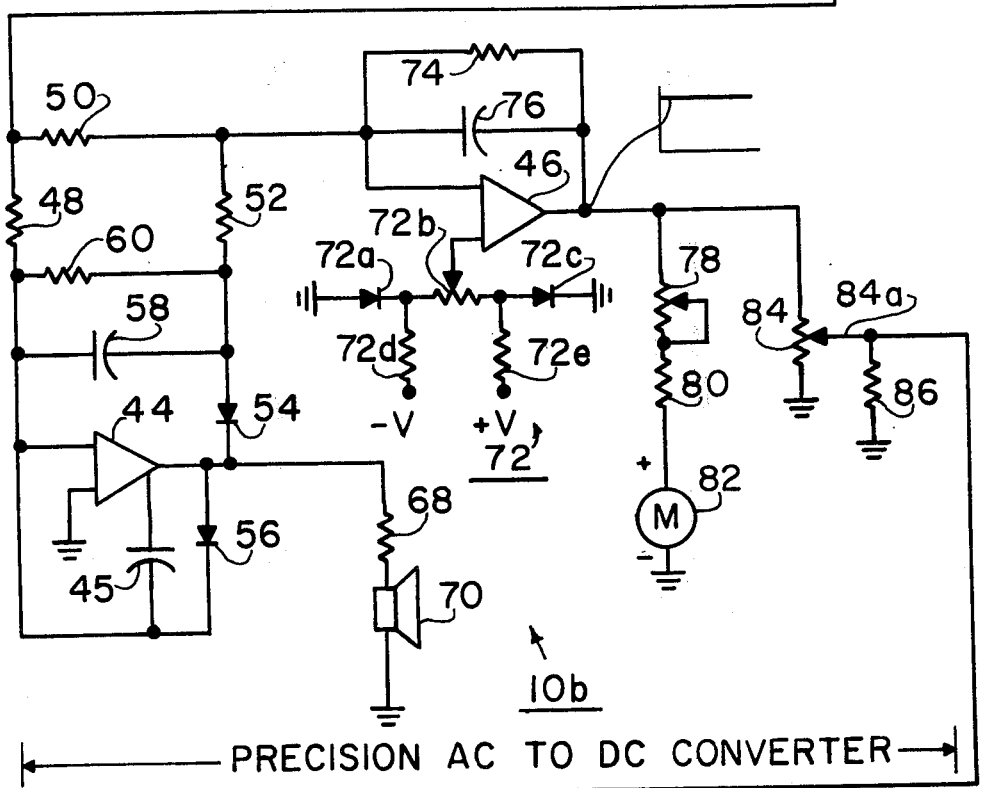

WIDE-RANGE LOGARITHMIC RESPONDING TRANSLATION CIRCUIT

BACKGROUND OF THE INVENTION

The present invention relates to translation circuits which respond linearly to logarithmic changes in input signals and, more particularly, to a wide-range logarithmic responding circuit which can be used to provide a voltmeter transducer analyzer which is sensitive to input signals which may vary over a 10 decade range.

Transducer analyzing devices such as voltmeters which respond linearly to decibel changes in input signals are known and have been widely used in the art. These prior art voltmeters are of limited usefulness, however, as their dynamic ranges are particularly limited, e.g. 40 to 60 db. Further, the sensitivity of these prior art voltmeters is typically limited to one millivolt; and in order to extend the dynamic range of these voltmeters to levels below one millivolt, an additional or "outboard" preamplifier is required.

These prior art voltmeters are typically arranged to first rectify the incoming signal to provide a "one-quadrant", unidirectional or D.C. interim signal, and thereafter a D.C.-coupled, one-quadrant logarithmic converter or amplifier is used to provide an output signal to a display device or meter. In addition to having limited sensitivity, these prior art voltmeters suffer with several disadvantages. For example, due to the use of DC-coupled circuitry, compensation circuitry for component and temperature variations is necessarily sophisticated and complex; the dynamic range is limited to a range of about 40 to 60 db maximum. Further, when the input signal is removed from the voltmeter, the output display meter either fluctuates wildly or its moving member remains pinned against the left meter stop; overall frequency response is limited as each voltmeter stage must exhibit very wideband frequency characteristics if the cascaded combination of stages is to be wideband; and, input signal levels below approximately one millivolt require external preamplification.

These and other disadvantages are overcome by the present invention wherein the input signal is first A.C. logarithmically amplified and converted; thereafter, the A.C. output of the converter is rectified and then applied to the output display device or meter. Accordingly, in accordance with the present invention, only one stage need be DC-coupled; D.C. rectification of the converter output signal is relatively simple as the levels thereat are relatively high; stringent frequency response considerations are primarily applicable to only one stage, i.e., the A.C. logarithmic converter stage; and, overall accuracy of the output indication is largely dependent only on one stage, again the logarithmic conversion stage. Further advantages provided by the present invention are that relatively simple circuitry can be deployed, and very low power drain is attained.

SUMMARY OF THE INVENTION

Briefly, the present invention provides a method and apparatus for deriving a unidirectional output signal from a given alternating current input signal and wherein the output is logarithmically proportional to the input signal. The apparatus comprises a translating circuit having input means for receiving the given alternating current input signal. Means are provided for amplifying the input signal to provide an interim alternating current signal which is proportional to the logarithm of the input signal. Means are also provided for rectifying, or for rectifying and filtering, the interim signal to provide a direct current output signal which is accordingly also proportional to the logarithm of the input signal.

BRIEF DESCRIPTION OF THE DRAWING

The advantages of this invention will become more readily appreciated as the same becomes better understood by reference to the following detailed description when taken in conjunction with the accompanying drawing wherein the single FIGURE illustrates a logarithmic responding voltmeter in accordance with the present invention.

DETAILED DESCRIPTION

Referring now to the drawing FIGURE there is shown generally at 10 a logarithmic responding voltmeter in accordance with the teachings of the present invention. One or more input signals are respectively applied to input connectors 12a and 12b. The input signals are coupled to operational amplifier 14 by way of a selector switch 15, a capacitor 16 and a sensitivity-range selecting network 18. Network 18 comprises a three-position switch 18a and three serially coupled resistors 18b, 18c and 18d, which are coupled between switch 15 and a fixed point of reference potential such as ground. The output of amplifier 14 is coupled to ground by way of a resistor 20 and a variable resistor 24. The junction of resistors 20 and 24 is coupled to a second input of amplifier 14.

The output of amplifier 14 is also coupled to an A.C. logarithmic amplifier stage or circuit 10a by way of a capacitor 26. Logarithmic amplifier circuit 10a comprises an operational amplifier 28 having a first input coupled to capacitor 26 by way of a resistor 30. A temperature compensating network including a resistor 32 and a temperature compensating resistor 33 is serially coupled across resistor 30. The output of amplifier 28 is coupled to its first input by way of back-to-back parallel diodes 34a and 34b. The output of amplifier 28 is also coupled to its first input by way of a feedforward capacitor 36. The second input of amplifier 28 is coupled to ground, and a second feedforward capacitor 40 is coupled between the first input of amplifier 28 and an internal input of amplifier 28. The output of amplifier 28 is also coupled to a precision A.C. to D.C. (AC/DC) rectifier or converter circuit 10b by way of a capacitor 42.

Converter circuit 10b includes operational amplifiers 44 and 46 each having a first input respectively coupled to capacitor 42 by way of resistors 48 and 50. The first input of amplifier 46 is coupled to the output of amplifier 44 by way of a resistor 52 and a diode 54. The output of amplifier 44 is coupled to its first input by way of a second diode 56. The cathode of diode 54 is coupled to the first input of amplifier 44 by way of the parallel combination of a feedforward capacitor 58 and a resistor 60. The second input of amplifier 44 is coupled to ground; and the output of amplifier 44 is coupled to ground by way of a resistor 68 and an electroacoustic transducer 70. A second feedforward capacitor 45 is coupled between a first input of amplifier 44 and an internal input of amplifier 44.

The second input of amplifier 46 is coupled to a balancing circuit 72. Circuit 72 includes a diode 72a, a variable resistor 72b and a diode 72c which are serially connected to ground at the end points of the serial connection. The junction of diode 72a and resistor 72b is coupled to a fixed point of negative reference potential (−V) by way of a resistor 72d. Similarly, the junction of resistor 72b and diode 72c is coupled to a fixed point of positive reference potential (+V) by way of a resistor 72e. The output of amplifier 46 is coupled to its first input by way of a resistor 74. A filtering capacitor 76 is coupled across resistor 74. The output of amplifier 46 is coupled to ground through serially coupled variable resistor 78, a fixed resistor 80 and a current meter 82. The output of amplifier 46 is also coupled to ground by way of variable resistor 84 and a fixed resistor 86. The junction of a variable arm 84a of resistor 84 and resistor 86 is coupled to a utilization means, which may be a chart recorder, an oscilloscope or any other display means or utilization device, as generally shown at 88.

The individual operational amplifiers, the associated circuitry and the various elements illustrated in the drawing are by themselves, that is, as individual building blocks, generally well-known. For a more detailed description of the various elements of the device illustrated in the drawing reference may be had to the National Semiconductor Corporation 1973 publication or handbook entitled "Linear Applications." For example, the precision rectifier or AC/DC converter 10b shown in the present drawing is described in detail at page LB8-2 of the handbook. Similarly, the general function of a balancing circuit such as balancing circuit 72 is described at page LB9-1; and the feedforward compensation technique as illustrated in the present drawing and as described briefly herein is described at length at page LB2-1 and 2 of the handbook. In one constructed embodiment of the present invention, as illustrated in the present drawing, the operational amplifiers were National LM301A types. Accordingly, the details of these individual circuit components and elements need not be described in great detail herein. It will be noted, however, that the function and structure of logarithmic converter circuit 10a, in accordance with the present invention, is readily distinguishable from and unlike the function and structure of the logarithmic converter described at Page AM30-1 and at other locations of the handbook.

The general operation of the combination of elements which provide a logarithmic voltmeter 10 in accordance with one embodiment of the present invention is described as follows. The input signal as selected by switch 15 is amplified by amplifier 14 and the gain of amplifier 14 is controlled by variable resistor 24 in the feedback circuit of amplifier 14. Amplifier 14 functions as a buffer amplifier to isolate the input signal source from the circuitry of voltmeter 10 and for impedance transformation therebetween. That is, amplifier 14 exhibits a relatively high input impedance, and a relatively low output impedance. As described more fully hereinafter, the gain adjustment of amplifier 14 as provided by variable resistor 24 facilitates range or full-scale adjustment of the display device of the logarithmic responding voltmeter 10 in accordance with the present invention. The output of amplifier 14 is coupled through capacitor 26 to amplifier 28 of logarithmic amplifier circuit 10a. The overall gain of amplifier 28 is determined by the series impedance in its feedback loop which comprises resistors 32, 33 and 30 and back-to-back parallel, log conversion diodes 34a and 34b. Resistors 32 and 33 also function to provide relatively simple temperature compensation of log conversion diodes 34a and 34b so that the overall amplification characteristics of the logarithmic amplifier are substantially independent of variations of ambient temperature. The bandwidth characteristics of amplifier 28 are substantially increased and enhanced by feedforward compensation which compensation is provided by capacitors 36 and 40 as described in the above-identified handbook.

Diodes 34a and 34b individually exhibit an expotential voltage-current characteristic, and their back-to-back combination also exhibits such a characteristic. Since diodes 34a and 34b are disposed in the feedback loop or path of amplifier 28, they function to provide a logarithmic input-output relationship with respect to input and output signals; and, the back-to-back combination of these nonlinear elements provides symmetrical, logarithmic amplification. It will now be appreciated by those skilled in the art that the general configuration of amplifier 28 as illustrated in the present drawing is more in the nature of a limiter or clipper circuit as otherwise known in the art. However, it will be noted and appreciated by those skilled in the art that the function of amplifier 28 and its associated circuitry as used herein provides an A.C. logarithmic amplifier or converter. It will also be noted that with no input applied to amplifier 28, the only output signal provided at capacitor 42 is the residual "op-amp" noise of amplifier 28, that is, as generated within amplifier 28 itself. It will be appreciated by those skilled in the art that such an amplifier, i.e., amplifier 28 and its associated circuitry, can readily be provided as a wide bandwidth amplifier having on the order of 100 db of dynamic range, or more.

Another important distinguishing feature of amplifier 28 and its associated circuitry, in accordance with the present invention, is that means including a feedback loop and responsive to the input signal are provided for controlling the gain of amplifier 28 over a range of gains including the open loop gain of amplifier 28. That is, the open loop gain of amplifier 28 and the range of gains near the open loop gain are advantageously utilized during the operation of amplifier 28 to provide an output signal which is proportional to the logarithm of the input signal. In the disclosed embodiment, back-to-back parallel diodes 34a and 34b are disposed in the feedback loop of amplifier 28 and function to control the gain of the amplifier. When the input signal is at a very low level, or when the alternating current input signal is passing through zero, diodes 34a and 34b are essentially cutoff or non-conducting. Since diodes 34a and 34b are serially coupled in the feedback loop of amplifier 28, the gain of amplifier 28 is essentially its open loop gain when diodes 34a and 34b are cutoff or non-conducting. Thus, the maximum loop gain (open loop gain) of the amplifier can be utilized for low level signals and for any input signal as it passes through zero.

In this regard, it is well known in the art that the log of zero is minus infinity (−∞); accordingly, the output signal of a D.C. logarithmic converter tends toward −∞ when its input signal is zero. However, in accordance with the present invention an A.C. logarithmic converter is provided and in the disclosed embodiment, back-to-back diodes 34a and 34b function to cancel or eliminate this −∞ output condition. That is, as the input signal passes through zero, one diode is driven to cutoff but during this time the other diode begins to conduct and provides feedback to cancel the −∞ condition.

Moreover, during this transition time there is an interval when both diodes are cutoff and the open loop gain of the amplifier is available. Further, the full range of amplifier gains about its open loop gain is also utilized. It should now be appreciated that very low level signals, e.g. 10 microvolts, are amplified by essentially the full or open loop gain of amplifier 28, which gain can readily be provided on the order of 80–100 db. Accordingly, preamplification such as that provided by a prior art outboard preamplifier need not be provided.

The output of amplifier 28 at capacitor 42 is half-wave rectified by amplifier 44 and its associated circuitry and the half wave rectified signal is summed with the output of amplifier 28 at the first input of amplifier 46. Accordingly, as described in the above-identified handbook, the output signal of amplifier 46 is a full wave rectified version of the output of amplifier 28 of converter circuit 10a.

It will be noted that amplifier 44 and its associated circuitry function as an ideal diode. That is, the threshold voltage of amplifier 44 is reduced by its feedback loop wherein the threshold voltage is divided by the open loop gain of the amplifier. Accordingly, even millivolt signals are rectified, i.e., without having to exceed a diode threshold potential. Filtering capacitor 76, which is coupled across amplifier 46 in a classical "op-amp" integrator configuration, acts to provide a smooth or pure D.C. level at the output of amplifier 46. It will now be appreciated that the rectified and filtered D.C. voltage at the output of amplifier 46 is proportional to the logarithm of the input signal as applied to connector 12a or 12b at the input of logarithmic responding voltmeter 10. It will also be appreciated that the filtering function can be eliminated if desired, e.g., in those situations where a pure D.C. output signal is not required or desired. Capacitors 45 and 58 provide feedforward compensation.

Variable resistor 72b is a zero adjust for nulling any offsets in amplifiers 44 and 46 as well as any residual noise at the output of, or introduced by, amplifiers 14 and 28. Accordingly, with no input or a zero level input, the output meter 82 reads exactly zero as opposed to being pinned off-scale or fluctuating wildly as occurs in the indicating devices of prior art logarithmic responding voltmeters. Resistors 78 and 84 respectively act to calibrate meter 82 and utilization device 88, e.g. in db/division. As previously alluded to, variable resistor 24 in the feedback circuit of amplifier 14 is adjusted to provide a full-scale indication at meter 82 or utilization device 88, while resistors 78 and 84 act to provide the desired calibration. In an embodiment of the present invention which is currently preferred for manufacture, resistors 24, 78 and 84 are provided as inaccessible internal controls which are initially and finally set during manufacture.

It should now be appreciated that the A.C. logarithmic converter 10a functions to provide wide dynamic range, and an output signal which is logarithmically proportional to its input signal and at a relatively high level which is readily converted to a unidirectional signal by means of relatively simple circuitry. Further, since converter circuit 10a, in accordance with the present invention, is AC-coupled, these results are readily achieved as the characteristic DC-coupled circuitry shortcomings of the prior art are avoided. That is, high-gain, stability, wide-bandwith and simple temperature compensation are characteristics which follow from and are provided by the structure of the present invention. In contrast, the prior art devices first rectify the A.C. input signal to provide a unidirectional or D.C. interim signal and then use a DC-controlled logarithmic converter, accordingly: compensation for temperature and component variations is inordinately complex; dynamic range is limited to 40–60 db and, therefore, input signals below 1 millivolt require external preamplification; and, frequency response or bandwidth is limited by both the rectification stage and the subsequent D.C. log-converter stage.

Further, since a D.C. or one-quadrant signal is applied to the log converter of prior art devices, the output of the converter is unstable when the input is zero as the logarithm of zero is minus infinity ($-\infty$). Hence, with a zero level or no signal applied to the input of these prior art devices, the pointer of the output meter is either pinned against its stop or fluctuating wildly. It will be noted, however, that the A.C. logarithmic converter in accordance with the present invention provides a stable output signal even when the input signal is zero. Further, any residual noise or offsets which are not attributable to the input signal are readily and stably nulled in the subsequent rectification stage.

It will be appreciated by those skilled in the art that the present invention provides a translation circuit and method for deriving a unidirectional output signal from an input signal which may vary over a given wide range, and wherein the unidirectional signal is logarithmically proportional to the input signal. The circuit is particularly suitable for use as a wide-range logarithmically responding voltmeter. In this embodiment the voltmeter is particularly suitable for use with low-level signal sources such as, for example, magnetic cartridges. Accordingly, the voltmeter accomodates testing of stereo cartridges for channel balance, frequency response and separation directly, i.e. without preamplification. The voltmeter is also particularly suitable for use as a means for measuring the input-output characteristics of sensitive preamplifiers, or the amplified signal versus residual hum and noise characteristics of a given electronic system. It will be appreciated that the wide dynamic range provided by a voltmeter in accordance with the present invention permits testing and measuring such input-output signals without having to change ranges or scales during the testing sequence.

Electroacoustic transducer 70 functions as a convenient means for providing an audible output of the input signal as applied to voltmeter 10; and, accordingly, the audio output provides another monitoring indication to the operator e.g. that the input signal is present in addition to the type of input signal present.

It should be noted that although the disclosed embodiment of the voltmeter in accordance with the present invention utilizes a buffer amplifier, good results are readily attained without any amplification stage prior to the A.C. logarithmic converter stage 10a. Such a buffer amplifier merely serves to provide isolation and impedance transformation in accordance with a preferred embodiment of the present invention.

It should be appreciated that the overall power drain of the translation circuit described herein in accordance with the present invention, is extremely low relative to the prior art volt-meters. This is due to the lower consumption of the stages therein as only the logarithmic amplifier and its input circuitry need be wideband and the precision rectifying circuit can be of a low power configuration. It should also be noted that input sensitivity of a logarithmic responding voltmeter, in accordance with the present invention, as depicted herein is about 10 microvolts whereas, however, the sensitivity of prior art voltmeters is limited to one millivolt.

What has been taught, then, is a wide-range logarithmic responding translation circuit facilitating, notably, a logarithmic responding voltmeter suitable for use as a multi-purpose transducer analyzer. The form of the invention illustrated and described herein is one preferred embodiment of these teachings. It is shown as an illustration of the inventive concepts, however, rather than by way of limitation, and it is pointed out that various modifications and alterations may be indulged in within the scope of the appended claims.

What is claimed is:

1. A translation circuit for deriving a substantially unidirectional output signal from a given alternating current input signal wherein said unidirectional output signal is logarithmically proportional to said input signal, said circuit comprising, in combination:

input means for receiving said input signal;

means for substantially symmetrically amplifying said input signal to provide an alternating current interim signal at an output thereof which is substantially continuously proportional to the logarithm of said input signal;

said amplifying means having a bidirectional feedback loop for coupling alternating current feedback signals indicative of said interim signal to the input of said amplifying means, and said feedback loop including means responsive to said input signal for controlling the gain of said amplifying means over a range of gains including the open loop gain of said amplifying means; and, means for rectifying said interim signal to provide said unidirectional output signal wherein said rectifying means comprises a precision AC/DC converter including at least one operational amplifier having an input coupled to an output of said means for amplifying said input signal, and said operational amplifier having a feedback loop which includes means for reducing the input threshold voltage of said operational amplifier wherein said threshold voltage is divided by the open loop gain of said operational amplifier.

2. The circuit according to claim 1, including a first capacitive impedance coupled between said amplifying means and said rectifying means for applying said interim signal to said rectifying means.

3. The circuit according to claim 2, wherein said rectifying means includes means for filtering said unidirectional output signal to provide a substantially pure direct current output signal.

4. The circuit according to claim 1, wherein said input signal is a voltage signal which may vary within the range of about 10 microvolts to at least 1 volt.

5. The circuit according to claim 1, wherein said means for rectifying includes means for controlling the level of said unidirectional output signal to a substantially zero level when the level of said input signal is substantially zero.

6. The circuit according to claim 1, wherein said means for amplifying includes a second operational amplifier having an input coupled to said input means and an output coupled to said rectifying means, wherein said bidirectional feedback loop is coupled between the input and output of said second operational amplifier, and wherein said bidirectional feedback loop includes first and second non-linear elements for respectively controlling the gain of said second operational amplifier as said input signal varies about a given point of reference potential whereby said first element controls the gain of said second operational amplifier when the level of said input signal is greater than said point of reference potential and said second element controls the gain of said second operational amplifier when the level of said input signal is less than said point of reference potential.

7. The circuit according to claim 6, wherein said first and second elements respectively comprise first and second diodes coupled to provide substantially symmetrical amplification of said input signal.

8. The circuit according to claim 7, wherein said bidirectional feedback loop includes a temperature compensating element coupled with said diodes so that the gain of said second operational amplifier is substantially independent of temperature.

9. The circuit according to claim 6, wherein said second operational amplifier includes feedforward capacitor compensation for substantially increasing the bandwidth of said second operational amplifier.

10. A logarithmically responding voltmeter suitable for use with low level A.C. voltage input signals which may vary over a given range, said voltmeter comprising, in combination:

an input means for receiving said input signals;

an A.C. logarithmic converter coupled to said input means for symmetrically amplifying said input signals to provide an A.C. output signal which is substantially continuously logarithmically proportional to said input signals, said converter having a bidirectional feedback loop coupled between its input and output;

a precision rectifier having an input coupled to the junction of said output of said converter and said feedback loop, and responsive to said A.C. output signal to provide a D.C. output signal which is proportional to said A.C. output signal, wherein said precision rectifier comprises a precision AC/DC converter including at least one operational amplifier having an input coupled to said junction, and said operational amplifier having a feedback loop which includes means for reducing the input threshold voltage of said operational amplifier wherein said threshold voltage is divided by the open loop gain of said operational amplifier; and means coupled to said precision rectifier and responsive to said D.C. output signal for indicating the level of said input signals over said given range.

11. The voltmeter according to claim 10, including means for nulling spurious signals generated within said voltmeter so that the indicating means indicates a substantially zero level when the level of said input signals is zero.

12. The voltmeter according to claim 10, wherein the indicating means includes means for providing calibrated indicia of said input signals.

13. The voltmeter according to claim 10, including means coupled to said rectifier for filtering said D.C. output signal to provide a substantially pure D.C. output signal.

14. The voltmeter according to claim 10, wherein said given range is about 10 microvolts to at least 1 volt.

15. The voltmeter according to claim 10, wherein said precision rectifier is a full wave rectifier.

16. The voltmeter according to claim 10, including a first capacitor coupled between said input means and said converter for applying said input signals to said converter and a second capacitor coupled between said converter and said rectifier for applying said A.C. output signal to said rectifier.

17. The voltmeter according to claim 10, wherein said logarithmic converter includes an amplifier having means including said bidirectional feedback loop and responsive to said input signal for controlling the gain of said converter amplifier over a range of gains including the open loop gain of said converter amplifier.

18. The voltmeter according to claim 17, wherein said converter comprises an operational amplifier having an input coupled to said input means and an output coupled to said rectifier, the bidirectional feedback loop of said converter operational amplifier including a first non-linear element for controlling the gain of said converter amplifier when the level of said input signal is greater than a given point of reference potential and said bidirectional feedback loop including a second non-linear element for controlling the gain of said converter amplifier when the level of said input signal is less than said given point of reference potential.

* * * * *